United States Patent
Myers-Ward et al.

(10) Patent No.: US 10,256,094 B2
(45) Date of Patent: Apr. 9, 2019

(54) REDUCTION OF BASAL PLANE DISLOCATIONS IN EPITAXIAL SIC USING AN IN-SITU ETCH PROCESS

(71) Applicants: Rachael L. Myers-Ward, Springfield, VA (US); David Kurt Gaskill, Alexandria, VA (US); Charles R. Eddy, Jr., Columbia, MD (US); Robert E. Stahlbush, Silver Spring, MD (US); Nadeemmullah A. Mahadik, Springfield, VA (US); Virginia D. Wheeler, Alexandria, VA (US)

(72) Inventors: Rachael L. Myers-Ward, Springfield, VA (US); David Kurt Gaskill, Alexandria, VA (US); Charles R. Eddy, Jr., Columbia, MD (US); Robert E. Stahlbush, Silver Spring, MD (US); Nadeemmullah A. Mahadik, Springfield, VA (US); Virginia D. Wheeler, Alexandria, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 260 days.

(21) Appl. No.: 14/204,015

(22) Filed: Mar. 11, 2014

(65) Prior Publication Data
US 2014/0193965 A1 Jul. 10, 2014

Related U.S. Application Data

(63) Continuation-in-part of application No. 12/860,844, filed on Aug. 20, 2010.

(Continued)

(51) Int. Cl.
B44C 1/22 (2006.01)
H01L 21/02 (2006.01)
(Continued)

(52) U.S. Cl.
CPC ...... H01L 21/02658 (2013.01); C30B 25/183 (2013.01); C30B 25/20 (2013.01);
(Continued)

(58) Field of Classification Search
CPC ......... H01L 21/30621; H01L 21/02378; H01L 21/02529; H01L 21/0445; H01L 21/045
(Continued)

(56) References Cited

U.S. PATENT DOCUMENTS

| 4,912,064 A | 3/1990 | Kong et al. |
| 8,652,255 B2 | 2/2014 | Stahlbush et al. |

(Continued)

FOREIGN PATENT DOCUMENTS

| JP | WO 2011074453 A1 * | 6/2011 | ........... C30B 25/186 |
| JP | WO 2011158528 A1 * | 12/2011 | ....... H01L 29/66068 |
| WO | 2012067112 A1 | 5/2012 | |

OTHER PUBLICATIONS

Camara et al.; Solid-State Electronics 46, 2002, pp. 1959-1963, "Study of the reactive ion etching of 6H-SiC and 4H-SiC in SF6/Ar plasma by optical emission spectroscopy and laser interferometry".*

(Continued)

Primary Examiner — Binh X Tran
(74) Attorney, Agent, or Firm — US Naval Research Laboratory; Joseph T. Grunkemeyer

(57) ABSTRACT

A method of: providing an off-axis 4H—SiC substrate, and etching the surface of the substrate with hydrogen or an inert gas.

12 Claims, 3 Drawing Sheets

Related U.S. Application Data

(60) Provisional application No. 61/787,903, filed on Mar. 15, 2013, provisional application No. 61/235,455, filed on Aug. 20, 2009.

(51) Int. Cl.

| | | |
|---|---|---|
| *C30B 25/20* | (2006.01) | |
| *C30B 29/36* | (2006.01) | |
| *C30B 25/18* | (2006.01) | |
| *H01L 21/3065* | (2006.01) | |

(52) U.S. Cl.
CPC ........ *C30B 29/36* (2013.01); *H01L 21/02378* (2013.01); *H01L 21/02433* (2013.01); *H01L 21/02447* (2013.01); *H01L 21/02529* (2013.01); *H01L 21/02617* (2013.01); *H01L 21/3065* (2013.01)

(58) Field of Classification Search
USPC .............................. 216/58, 79; 438/718, 931
See application file for complete search history.

(56) References Cited

U.S. PATENT DOCUMENTS

| | | | |
|---|---|---|---|
| 2001/0011729 A1* | 8/2001 | Singh | H01L 29/66068 257/77 |
| 2006/0011128 A1 | 1/2006 | Ellison et al. | |
| 2007/0108450 A1 | 5/2007 | O'Loughlin et al. | |
| 2007/0290211 A1 | 12/2007 | Nakayama et al. | |
| 2010/0237356 A1* | 9/2010 | Haney | H01L 29/1608 257/77 |
| 2010/0308337 A1* | 12/2010 | Sriram | H01L 29/872 257/73 |
| 2011/0045281 A1 | 2/2011 | Myers-Ward et al. | |
| 2012/0018737 A1* | 1/2012 | Zhang | H01L 29/66068 257/77 |
| 2012/0214309 A1* | 8/2012 | Itoh | H01L 29/66068 438/700 |
| 2012/0280254 A1* | 11/2012 | Muto et al. | 257/77 |
| 2013/0062628 A1* | 3/2013 | Das et al. | 257/77 |
| 2013/0143396 A1* | 6/2013 | Sudarshan et al. | 438/503 |
| 2013/0217213 A1 | 8/2013 | Aigo et al. | |
| 2014/0145214 A1* | 5/2014 | Kageshima et al. | 257/77 |
| 2014/0190399 A1* | 7/2014 | Myers-Ward et al. | 117/97 |

OTHER PUBLICATIONS

Sagar et al. "Morphology and effects of hydrogen etching of porous SiC", Journal of Applied Physics, vol. 92, No. 7, pp. 4070-4074, 2002), herein after refer as Sagar.*
Gaskill et al., "Managing Basal Plane Dislocations in SiC: Perspectives and Prospects" ECS 2012 (Oct. 2012).
Myers-Ward et al., Spontaneous Conversion of Basal Plane Dislocations in 4H-SiC Epitaxial Layers ISCSRM 2011 (Sep. 12, 2011).
Myers-Ward et al., "Putting an End to BPDs Starts with Hydrogen Etching" ICSCRM 2103 (Oct. 2013).
Myers-Ward et al., "BPD Conversion in a Thin SiC Buffer Layer" TMS2013 (Mar. 6, 2013).
Myers-Ward et al., "Conversion of BPDs in a Thin SiC Buffer Layer" 2012 Spring Materials Research Society Conference (Apr. 10, 2012).
Myers-Ward et al., "Managing Basal Plane Dislocations in SiC: Perspective and Prospects" ECS Transactions, 50 (3) 103-108 (Oct. 2012).
Stahlbush et al., "Whole-Wafer Mapping of Dislocations in 4H-SiC Epitaxy" Materials Science Forum vols. 556-557 (2007) pp. 295-298.
Stahlbush et al., "Mechanisms of Stacking Fault Growth in SiC PiN Diodes" Mat. Res. Soc. Symp. Proc. vol. 815, J6.4.1 (2004).
Tsuchida et al., "Investigation of Basal Plane Dislocations in the 4H-SiC Epilayers Grown on {0001} Substrates" Materials Science Forum vols. 483-485 (2005) pp. 97-100.
Zhang et al., "Mechanism of eliminating basal plane dislocations in SiC thin films by epitaxy on an etched substrate" Appl. Phys. Lett. 89, 081910 (2006).
Search Report and Written Opinion in PCT/2014/023148 (dated Aug. 27, 2014).
Office Action in U.S. Appl. No. 14/204,045 (dated Sep. 22, 2014).
Office Action in U.S. Appl. No. 14/204,045 (dated Mar. 6, 2015).
Examiner's Answer in U.S. Appl. No. 14/204,045 (dated Jan. 8, 2016).

* cited by examiner

REDUCTION OF BASAL PLANE DISLOCATIONS IN EPITAXIAL SiC USING AN IN-SITU ETCH PROCESS

This application claims the benefit of U.S. Provisional Application No. 61/787,903, filed on Mar. 15, 2013. This application is a continuation-in-part application of pending U.S. patent application Ser. No. 12/860,844, filed on Aug. 20, 2010, which claims the benefit of U.S. Provisional Application No. 61/235,455, filed on Aug. 20, 2009. These applications are incorporated herein by reference.

TECHNICAL FIELD

The present disclosure is generally related to SiC epitaxial growth.

DESCRIPTION OF RELATED ART

Since the ABB (Asea Brown Boveri, Inc.—Sweden) power company disclosed the forward voltage, $V_f$, drift problem that degraded their PiN diodes (Lendenmann et al., *Mater. Sci. Forum*, 353-356 (2001) 727-730), it has been well established that the $V_f$ drift problem is due to stacking faults that originate from basal plane dislocations (BPDs) and that the only way to overcome this problem is to reduce the BPD density in low-doped portions of the epitaxial layer that forms the active region of SiC power devices. The major source of BPDs in the epitaxy is from BPDs in the SiC substrate. At the start of epitaxial growth, 70-90% of the substrate BPDs are converted to threading edge dislocations (TEDs) and the resulting BPD density in the epitaxy is typically in the 100-1000 $cm^{-2}$ range; a further reduction to<1 $cm^{-2}$ is required for device production, based on the area of desired devices. For devices requiring higher power, the problem of BPDs becomes exacerbated since these devices require larger areas and hence further reduction of BPDs is essential.

Several techniques have been developed to decrease BPD density in the epitaxy. One technique uses a growth interrupt to turn the BPDs into TEDs (VanMil et al., *PCSI* (2008); U.S. Pat. No. 8,652,255). Two other techniques alter the wafer surface before epitaxial growth. The first is a surface patterning process that was originally developed and patented by ABB and later used by Cree (Sumakeris et al., *Mater. Sci. Forum*, 527-529 (2006) 141-146). The second is a process that involves KOH etching, epitaxial growth, and repolishing. It was developed and patented by Cree. Cree has tested both processes and found the KOH etching method to be more effective (Sumakeris Id.). Another technique is to grow the epitaxial layers on wafers with an offcut angle lower than the standard 8° angle used for 4H—SiC (Chen et al., *J. Appl. Phys.* 98 (2005) 114907). The tradeoff is that lowering the offcut angle tends to introduce 3C inclusions that degrade device performance (Kojima et al., *J. Cryst. Growth*, 269 (2004) 367-376). Growth on 4° offcut substrates has also been demonstrated to convert BPDs to TEDs throughout the epitaxial growth process (U.S. Patent Appl. Pub. No. 2011/0045281).

BRIEF SUMMARY

Disclosed herein is a method comprising: providing an off-axis 4H—SiC substrate; and etching the surface of the substrate with hydrogen or an inert gas.

BRIEF DESCRIPTION OF THE DRAWINGS

A more complete appreciation of the invention will be readily obtained by reference to the following Description of the Example Embodiments and the accompanying drawings.

DETAILED DESCRIPTION OF EXAMPLE EMBODIMENTS

Figure 1:
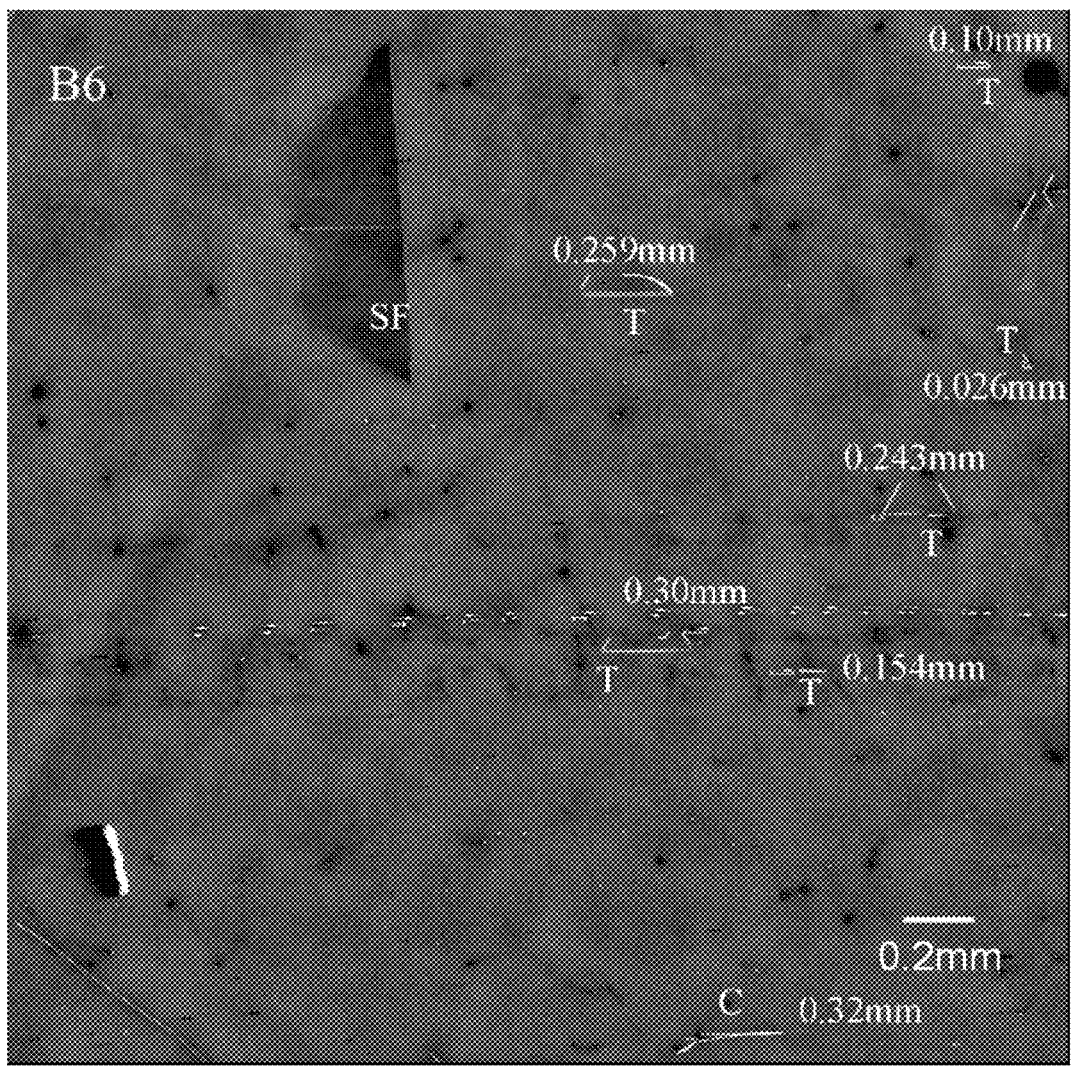
FIG. 1 shows a UVPL image of UID film showing various lengths of BPDs; C=continued, T=turned (converted to TED). Image sizes are 3 mm×3 mm.

In the following description, for purposes of explanation and not limitation, specific details are set forth in order to provide a thorough understanding of the present disclosure. However, it will be apparent to one skilled in the art that the present subject matter may be practiced in other embodiments that depart from these specific details. In other instances, detailed descriptions of well-known methods and devices are omitted so as to not obscure the present disclosure with unnecessary detail.

The method may be employed in a wide range of bipolar SiC device technologies enabling them to achieve higher performance levels. Such devices range from power diodes and switches to rf transistors and UV photodetectors. The purpose of using a hydrogen etch prior to a SiC epitaxial growth process on 4° off-axis substrates is to reduce BPDs within the active regions of SiC devices leading to improved device performance and reliability. The etch process is used to increase the conversion of basal plane dislocations into threading edge dislocations and have the converted BPDs in a thin highly doped buffer layer. It has been demonstrated that BPDs cause increasing forward voltage drift in bipolar SiC devices and there are also reports in the literature that they can degrade majority carrier mobility and increase reverse-biased leakage (Agarwal et al., *Elec. Dev. Lett.*, 28 (2007) 587). BPD reduction processes that utilize epitaxial growth are all based on the principle of converting BPDs into TEDs, which have negligible adverse effects on the SiC devices.

In the disclosed method an off-axis 4H—SiC substrate is used. The off angle may be, but is not limited to, 4°. The surface of the substrate is then etched with hydrogen or an inert gas, such as argon. The etching takes place before any epitaxial growth. Suitable etching conditions include, but are not limited to, 1620-1665° C., 40-130 mbar of the etching gas, and 5-90 minutes of etching.

After the etching, a doped buffer layer may be grown on the substrate. The buffer layer may be doped with, for example, $N^+$, and may be about 6.5-8 µm thick. An epitaxial silicon carbide layer may then be grown on the buffer layer.

To determine the efficacy of the method, investigations were carried out using the following approach. To determine where the BPD converts to a TED in the epitaxial layer, 3 key ingredients are required: (1) the length of the BPD photoluminescence image taken in the plan view, (2) the orientation of the surface with respect to the basal plane of the sample (also known as the off-cut angle), and (3) the thickness of the epitaxial layer. For the first, ultra-violet photoluminescence images (UVPL images) were obtained using well-established techniques previously published (Stahlbush et al., *Mater. Sci. Forum* 556-55 (2007) 295). X-ray diffraction (XRD) rocking curve maps of the symmetric (0008) reflection were analyzed to determine the off-cut angle of the substrates. The manufacturer labels the wafers off-cut on the substrate wafer carrier, however, this is not always the exact off-cut. Additionally, this angle is not typically constant across the wafers (100, 75, or 50 mm) due to lattice curvature associated with the manufacturing process of the wafers. With that in mind, the precise, spatially-resolved off-cut angle determined from the XRD rocking curve measurement maps was used for each sample in the NRL research investigation which typically consisted of a quartered 75 or 100 mm wafer to determine what a full length BPD would be if it extended through to the epi surface. Finally, the third key ingredient was measuring the precise thickness of the epitaxial films, evaluated using Fourier transform infrared measurements. With (1), (2), and (3) and using standard geometry, the plan view length of a BPD could be converted to a z-axis distance that the BPD covered from the beginning of growth to where it ends. If the distance is found to be less than that of the epitaxial layer thickness, then the BPD is known to have converted in to a threading edge dislocation (TED). If the distance is equal to that of the epitaxial layer thickness, then the BPD did not convert to a TED in the epitaxial layer.

The injected carrier lifetimes of some of the samples were evaluated using room temperature time-resolved photoluminescence, were they varied from 1000 to 1800 ns. The surface roughness of a film may also influence the device properties as well as make processing difficult; therefore, AFM analysis was also performed to determine surface roughness. Samples investigated resulted in similar surface morphology, with a surface roughness of ~3.0 nm RMS. Carrier concentrations were also measured on several of the samples using Hg probe CV measurements, where the net carrier concentration was $\leq 2.5 \times 10^{14}$ cm$^{-3}$.

Table 1 summarizes the results of several experiments. The films were either unintentionally (UID) or intentionally doped (ID) net carrier concentration $< 4 \times 10^{14}$ cm$^{-3}$ using a nitrogen source gas. All films were grown at a temperature of ~1600° C., pressure of 100 mbar and gas phase carbon-to-silicon (C/Si) ratio of 1.55 using an Aixtron VP508 reactor. The temperature was ramped from room temperature to a temperature of 1400° C. in a hydrogen atmosphere. At this time, either the pressure was maintained at 100 mbar, or it was adjusted to a value between 40 mbar and 130 mbar. The temperature was then ramped to the etch temperature (between 1620° C. and 1665° C.). Once the temperature was reached, an etch step took place prior to the growth of a highly doped N$^+$ buffer layer. The thickness of the buffer layer was ~6.5 μm and was incorporated prior to the low doped epilayer, with the exception of one buffer layer thickness being ~8 μm. All samples were ~20 μm thick (not including buffer layers, where applicable) and were grown at ~10 μm/h, except sample C1110829, which was 13 μm thick and no buffer layer was grown. Experiments were conducted where only an etch took place to evaluate the surface of the substrate and determine the etch rate. It was found that the etch rate varied time and temperature and is shown in Table 2. The conversion process, i.e. instituting the in-situ etch, prior to growth was carried out for an epitaxial layer. UVPL images of this sample were analyzed and showed after a 50 min etch at 1620° C., 70 mbar and an 8.1 μm N$^+$ buffer layer, there were 144 BPDs extending out of the buffer into the unintentionally doped 20 micron layer.

TABLE 1

Tabulation of basal plane dislocations conversion efficiency for epitaxial growth on 4° off-axis substrates

| Sample ID | Substrate | Etch Time (min) | Etch T (° C.) | Etch P (mbar) | BL Thickness (μm) | Epi Thickness (μm) | BPD | BPD/cm² |
|---|---|---|---|---|---|---|---|---|
| C1110820 | BD1787-44-iv | 50 | 1620 | 70 | 8.13 | 19.57 | 144 | 26.2 |
| C1110829 | BD1796-51-iii | 50 | 1620 | 70 | 0 | 12.81 | 218 | 39.6 |
| C1110830 |  | 50 | 1620 | 70 |  |  |  |  |
| C1110927 | BD1796-51-iv | 50 | 1650 | 70 | 6.78 | 19.41 | 13 | 2.4 |
| C2111017 | BD1796-52-iv | 50 | 1665 | 70 | 6.5 | 18.5 | 10 | 1.8 |
| C2111019 | BD1796-52-ii | 50 | 1665 | 70 |  |  |  |  |
| C2111021A | BD1796-52-iii | 50 | 1665 | 70 |  |  |  |  |
| C2111025A | BD1787-40-i | 50 | 1665 | 70 |  |  |  |  |
| C2111109 | BD1787-40-ii | 90 | 1665 | 70 | 6.6 | 18.9 | 65 | 11.8 |
| C2120320 | BD1787-40-iii | 90 | 1665 | 40 | 6.7 | 19.2 | 145 | 26.4 |
| C2111229 | GW0608-10-iii | 5 | 1620 | 100 |  |  |  |  |
| C2120406A | BD1787-40-iv | 90 | 1665 | 100 |  |  | 73 | 13.3 |
| C2120406B | DA1090-52-ii | 90 | 1665 | 100 |  |  | 402 | 73 |
| C2120504 | DA1090-53-iii | 90 | 1665 | 130 |  |  | 286 | 52 |
| C2120709 | DA1090-53-i | 50 | 1650 | 70 |  |  |  |  |
| C2130204 | GT0011 | 50 | 1630 | 40 |  |  |  |  |
| G2130206 | GT0011 | 50 | 1630 | 70 | 6.5 | 19.7 | 61 | 5.3 |
| C2130207 | GT0011 | 50 | 1630 | 100 | 6.5 | 19.7 | 71 | 6.1 |
| C2130208 | GT0011 | 50 | 1630 | 130 | 6.5 | 19.7 | 203 | 17.5 |

TABLE 2

Amount of SiC removed during the hydrogen etch step

| Etch Time (min) | Etch Temperature (° C.) | Etch Pressure (mbar) | Material removed (μm) |
|---|---|---|---|
| 5 | 1620 | 70 | 0.45 |
| 50 | 1620 | 70 | 1.34 |
| 50 | 1665 | 70 | 3.13 |

Figure 2:
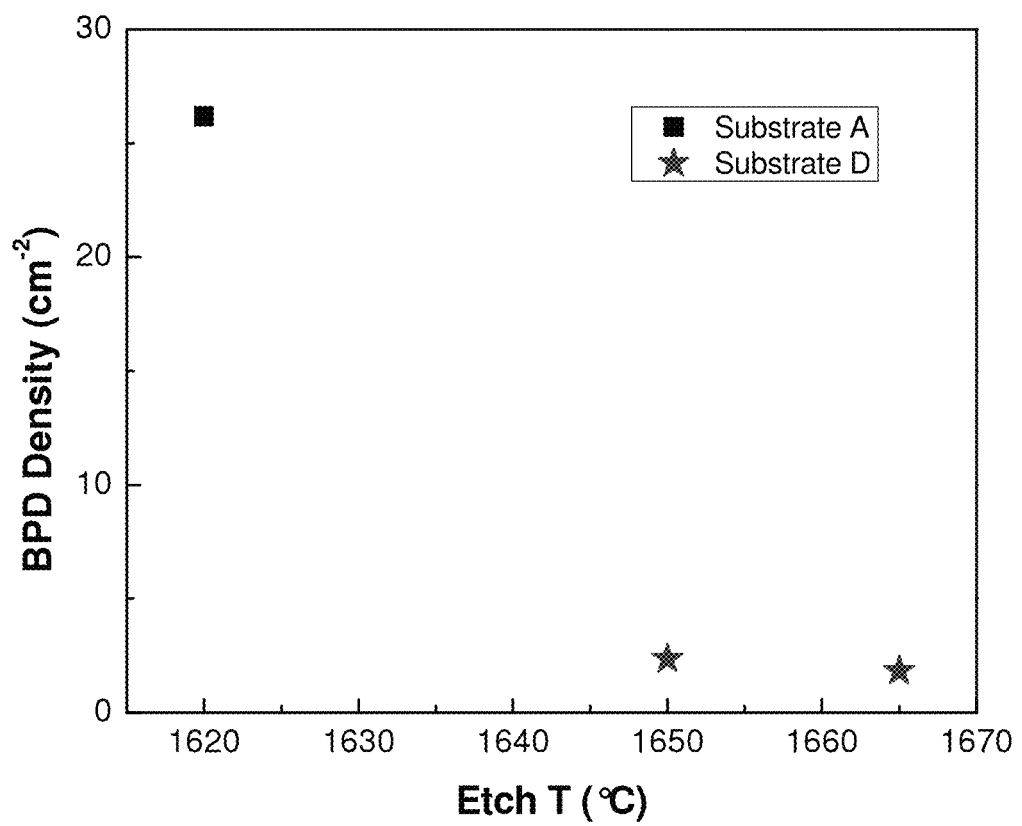
FIG. 2 shows BPD density as a function of etch temperature
Figure 3:
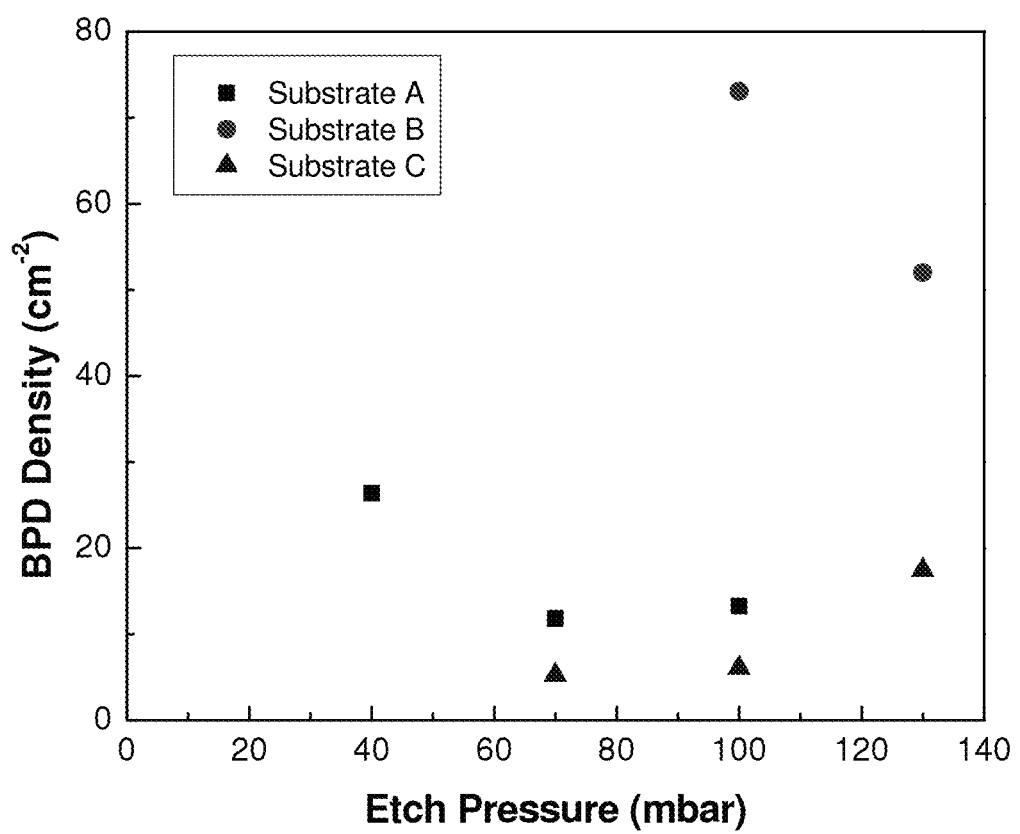
FIG. 3 shows BPD density as a function of etch pressure.

The full length of continuous BPDs were determined using XRD rocking curve maps and film thicknesses found by using FTIR measurements. The spatially-resolved XRD maps were used to determine the accurate off-cut angle of each quarter wafer prior to growth. After growth, incorporating the spatially-resolved thickness measurements combined with the off-cut angle, the expected full length BPD was determined. The BPD lengths were then measured from the UVPL images using the software program, "ImageJ" by measuring the horizontal length from left to right of the BPD, see FIG. 1. The lengths of the BPDs were then tallied and the conversion efficiency (number of BPDs that have converted to threading edge dislocations) was based on comparing the actual length of each BPD to the full length BPD. With the variation of lattice curvature across a quarter wafer, it was essential to obtain the precise measurement of the off-cut angle across the substrate, combined with the accurate film thickness to correctly identify the actual BPD full length and correctly reveal the trend of BPDs converting to TEDs within the epilayer. Plots of the BPD density as a function of etch temperature and pressure is shown in FIGS. 2 and 3. The temperature influences the conversion at elevated temperatures>1620° C. The pressure influences the conversion and is clearly seen in FIG. 3. There is an optimized pressure of 70-100 mbar for higher conversion of BPDs.

This process for determining conversion efficiency is more accurate than others used in the field. Typically, the BPD density is found using KOH etching, which creates etch pits on the surface of the wafer, and these pits are counted. A low BPD density that has been published in the literature is 2.6 cm$^2$ using KOH etching (Chen et al., *J. Appl. Phys.* 98 (2005) 114907). If the above samples had been investigated using KOH etching, the BPD density would be zero for the majority of the samples. However, from the UVPL images, it can be seen that the BPDs are turning throughout the film on 4° off-cut substrates. By using the KOH etching approach, the number of BPDs in the active region may be much higher than what is at the surface of the epilayer. This means that conclusions given by prior investigations using the KOH etching approach are not accurate and have only limited value in developing methods for BPD reduction. By employing the UVPL technique, the total number of BPD in the entire active region is determined. Therefore, the result of 10 BPDs in the epilayer shown in Table 1 is significant.

A phenomenon called "step bunching" may influence the conversion of BPDs into TEDs during the growth of epitaxial films on 4 degree off-cut substrates. The formation of multi-unit cell high surface steps may create a potential barrier to continued basal plane dislocation propagation out of the substrate and that an energy balance may be created that makes it more favorable for the BPD to convert to a TED than to continue propagating. Ha et al., *J. Cryst. Growth* 244 (2002) 257-266 describes that the image force is the driving force of BPD conversion to TED, speculates that "when the critical distance is small in the range of several bilayers or several nanometers, a dislocation can see two surfaces of the step structure, the terrace and the step, which are different from the average off-axis surface. In this case, the conversion will depend on the step structure". It is also reported that one "can expect that a basal plane dislocation will be attracted by the surface of the last one or two macro-steps and, that the 'step facet mechanism' . . . will be governing the dislocation conversion". Therefore, a processing window that is a function of growth rate, doping, off-cut angle, C/Si ratio, temperature and pressure determine the optimal condition for conversion rate. During the etching, etch pits may be formed on the surface and the BPDs may be converted to TEDs at the pit.

A hydrogen etch process prior to the epitaxial growth process on 4° off-axis enables the conversion of BPDs into TEDs—making it extremely manufacturable. It has been found experimentally that the BPDs convert to TEDs after the hydrogen etch process, followed by a thin, ~6.5 μm highly doped N$^+$ buffer layer and the lowest density of BPDs was 1.8 cm$^{-2}$. The process is easy to implement into a manufacturable process. Growing the N$^+$ buffer layer will enable one to bury the BPDs in a thinner buffer layer, producing a BPD free active region. This is the optimal situation as it will permit the economic realization of a wide range of high voltage, bipolar devices.

Other techniques that have been used to convert BPDs to TEDs during epitaxial growth are the three mentioned in the Background Art above. The first is patterning the surface of the SiC wafer before the epitaxial growth, which increases the BPD-to-TED conversion at the beginning of the growth. It has the tendency to increase other detrimental extended defects such as ingrown faults. The second technique is to etch the wafer in molten KOH before epitaxial growth. This creates pits at each of the dislocations including the BPDs, and this technique also increases the BPD-to-TED conversion at the beginning of the growth. However, the top of the growth surface remains pitted creating challenges for device manufacturing. An initial layer is grown and the wafer is polished to restore a smooth surface. It should be noted that this latter technique involves handling and wafers polishing which significantly adds to the overall cost of the final product. The third technique from Chen and Capano is to use wafers with a smaller offcut angle than the standard 8° angle. As with the previous techniques, it increases the BPD-to-TED conversion at the beginning of the growth. The tradeoff is that lowering the offcut angle results in step bunching which is more difficult to control. Further, such growths can lead to SiC polytype inclusions that are also device killers.

The reduction of BPDs relies on the conversion of BPDs to threading edge dislocations (TEDs) during the epitaxial growth process and/or the substrate/epilayer interface due to the etch process prior to growth as the surface is modified during the etch to improve the conversion of BPDs. The growth process includes a step that consists of ramping the temperature from room temperature to growth temperature, during which time hydrogen is flowing. The etching takes place for a certain amount of time, after which the growth process takes place. There are many parameters which may be varied during the ramp process and the growth process which may influence the BPD conversion efficiency and rate.

The following lists the specific process parameters which may be manipulated to result in optimal BPD conversion.

1) Propane flow rate during ramp to etch temperature and etch process—modifying the propane flow rate during ramp has been shown experimentally to influence the number of initial BPDs at the substrate/epilayer or buffer layer/epilayer interface (Myers-Ward et al., *Mat. Sci. Forum* 615-617 (2009) 105108)
2) Silane flow rate during ramp to etch temperature and during etch process—incorporate a silane flow during these steps
3) Temperature at which point the pressure is adjusted for the etch process—vary the temperature at which point the pressure for etch is modified to influence the BPD conversion
4) Temperature of etch step—vary the temperature during etch to influence the effect of step bunching and/or etch pits on the surface since this may be the key factor in converting BPDs into TEDs
5) Incorporating a halogen during the etch process before growth—Use the halogen to assist in etching the surface to influence the conversion of BPDs
6) Using an inert gas instead of hydrogen—Use Ar instead of hydrogen during the etch to control the surface of the material prior to growth, or a mixture of inert gas plus hydrogen gas 7) Vary the amount of hydrogen flow during the etch process—varying the flow will assist in modifying the surface to achieve the desired surface for the highest conversion rate
8) Etch Time—vary the etch time to achieve highest conversion rate
9) Pressure during etch—vary etch pressure to achieve highest conversion rate
10) Initiation of growth—Initiate the growth differently after the etch process Obviously, many modifications and variations are possible in light of the above teachings. It is therefore to be understood that the claimed subject matter may be practiced otherwise than as specifically described. Any reference to claim elements in the singular, e.g., using the articles "a," "an," "the," or "said" is not construed as limiting the element to the singular.

What is claimed is:

1. A method comprising:
providing an off-axis 4H—SiC substrate; and
etching the surface of the substrate with an inert gas.

2. The method of claim 1, wherein the substrate is a 4° off-axis 4H—SIC substrate.

3. The method of claim 1, wherein the inert gas is argon.

4. The method of claim 1, further comprising:
growing a doped buffer layer directly on the substrate after the etching.

5. The method of claim 4, further comprising:
growing an epitaxial silicon carbide layer on the doped buffer layer.

6. A method comprising:
providing a 4° off-axis 4H—SiC substrate;
etching the surface of the substrate with hydrogen; and
growing a doped buffer layer directly on the substrate after the etching.

7. The method of claim 6, wherein the doped buffer layer is doped with $N^+$.

8. The method of claim 6, wherein the doped buffer layer is about 6.5-8 μm thick.

9. The method of claim 6, further comprising:
growing an epitaxial silicon carbide layer on the doped buffer layer.

10. The method of claim 6, wherein the etching is performed at 40-70mbar of the hydrogen.

11. The method of claim 6, wherein the etching is performed for 5-90 minutes.

12. The method of claim 6, wherein the etching is performed at 1620-1665° C.

* * * * *